United States Patent
Komeda et al.

(10) Patent No.: US 11,825,601 B2
(45) Date of Patent: Nov. 21, 2023

(54) SUBSTRATE WITH CONDUCTIVE LAYER

(71) Applicant: Valqua, Ltd., Tokyo (JP)

(72) Inventors: Tetsuya Komeda, Gojo (JP); Hirotaka Muto, Machida (JP)

(73) Assignee: VALQUA, LTD., Tokyo (JP)

( * ) Notice: Subject to any disclaimer, the term of this patent is extended or adjusted under 35 U.S.C. 154(b) by 0 days.

(21) Appl. No.: 17/929,086

(22) Filed: Sep. 1, 2022

(65) Prior Publication Data

US 2023/0074201 A1    Mar. 9, 2023

(30) Foreign Application Priority Data

Sep. 2, 2021  (JP) ................................. 2021-143350

(51) Int. Cl.
*H05K 1/03*    (2006.01)
*H05K 1/09*    (2006.01)

(52) U.S. Cl.
CPC ............... *H05K 1/034* (2013.01); *H05K 1/09* (2013.01); *H05K 2201/015* (2013.01)

(58) Field of Classification Search
CPC ...................................... H05K 1/0313–1/0373
See application file for complete search history.

(56) References Cited

U.S. PATENT DOCUMENTS

| | | | |
|---|---|---|---|
| 11,212,916 | B2 | 12/2021 | Edmundson et al. |
| 2021/0112657 | A1 | 4/2021 | Edmundson et al. |

FOREIGN PATENT DOCUMENTS

| | | |
|---|---|---|
| JP | 2012515850 A | 7/2012 |
| WO | 2010083530 A2 | 7/2010 |
| WO | 2019216883 A1 | 11/2019 |

*Primary Examiner* — Jeremy C Norris
(74) *Attorney, Agent, or Firm* — THE WEBB LAW FIRM

(57) ABSTRACT

A substrate with a conductive layer including a substrate, which is a woven or nonwoven fabric containing polytetrafluoroethylene (PTFE) nanofibers; and a conductive layer formed on the substrate, the conductive layer being formed from a conductive composition with a viscosity in a range of 1 to 500 Pa·s measured at 25° C. with a rotational viscometer at a rotational speed of 50 rpm, wherein the following requirement (1) is satisfied: requirement (1); the substrate with a conductive layer has a Gurley permeability of 10 s/100 ml or less.

3 Claims, No Drawings

SUBSTRATE WITH CONDUCTIVE LAYER

CROSS-REFERENCE TO RELATED APPLICATION

This application claims priority to Japanese Patent Application No. 2021-143350 filed Sep. 2, 2021, the disclosure of which is hereby incorporated by reference in its entirety.

BACKGROUND OF THE INVENTION

1. Field of the Invention

An embodiment of the present invention relates to a substrate with a conductive layer.

2. Description of the Related Art

Flexible printed circuit boards have been known as circuit boards with flexibility. Although the flexible printed circuit boards have higher flexibility than circuit boards with a substrate made of a metal, such as copper, substrates of the flexible printed circuit boards are still rigid, for example, for use in wearable devices. Thus, there is a need for circuit boards with a more flexible substrate.

In this regard, for example,

Patent Literature 1: International Publication No. WO 2019/216883 discloses a flexible printed circuit board with a substrate formed of expanded polytetrafluoroethylene (e-PTFE).

SUMMARY OF THE INVENTION

Flexible printed circuit boards, for example, for use in wearable devices require air permeability in addition to flexibility. Known flexible printed circuit boards, however, have room for improvement also in air permeability.

A thermosetting conductive composition is sometimes used to form a conductive layer in flexible printed circuit boards. It has been found that when a known thermosetting conductive composition is used, known flexible printed circuit boards have insufficient heat resistance and undergo thermal contraction. Furthermore, electronic components are sometimes mounted on flexible printed circuit boards. It has also been found that known flexible printed circuit boards cannot sufficiently withstand high temperatures while mounting.

An embodiment of the present invention provides a substrate with a conductive layer that has high flexibility, air permeability, and heat resistance.

Under such circumstances, as a result of extensive studies, the present inventors have completed the present invention with the following configuration examples.

The configuration examples of the present invention are as follows:

[1] A substrate with a conductive layer including:
a substrate, which is a woven or nonwoven fabric containing polytetrafluoroethylene (PTFE) nanofibers; and
a conductive layer formed on the substrate, the conductive layer being formed from a conductive composition with a viscosity in a range of 1 to 500 Pa·s measured at 25° C. with a rotational viscometer at a rotational speed of 50 rpm,
wherein the following requirement (1) is satisfied.
requirement (1): the substrate with a conductive layer has a Gurley permeability of 10 s/100 ml or less.

[2] The substrate with a conductive layer according to [1], wherein the conductive composition contains a conductive filler and a thermosetting resin.

[3] The substrate with a conductive layer according to [1] or [2], wherein the substrate before the conductive layer is formed has a basis weight in a range of 10 to 200 g/m$^2$.

An embodiment of the present invention can provide a substrate with a conductive layer that has high flexibility, air permeability, and heat resistance.

An embodiment of the present invention can also form a desired conductive layer that does not cause separation and wire breakage even after a bending test on a PTFE substrate, which is essentially non-adhesive, and can provide a substrate with a conductive layer that is less likely to change in shape due to thermal contraction and that takes advantage of the characteristics of PTFE, such as cleanliness, insulating properties, and a low dielectric constant.

Furthermore, a substrate with a conductive layer according to an embodiment of the present invention has high heat resistance, as described above, and therefore can be subjected to sterilization, such as autoclave sterilization, when used in healthcare applications, for example.

DESCRIPTION OF THE INVENTION

<<Substrate with Conductive Layer>>

A substrate with a conductive layer according to an embodiment of the present invention (hereinafter also referred to as "the present substrate with a conductive layer") includes a substrate, which is a woven or nonwoven fabric containing polytetrafluoroethylene (PTFE) nanofibers, and a conductive layer formed on the substrate, the conductive layer being formed from a conductive composition with a viscosity in a range of 1 to 500 Pa·s measured at 25° C. with a rotational viscometer at a rotational speed of 50 rpm, wherein the following requirement (1) is satisfied:

requirement (1): the present substrate with a conductive layer has a Gurley permeability of 10 s/100 ml or less.

The present substrate with a conductive layer has a Gurley permeability of 10 s/100 ml or less, preferably 5 s/100 ml or less, and more preferably 1 s/100 ml or less. The lower limit of the Gurley permeability is, but not limited to, 0.1 s/100 ml or more, for example.

Although having the conductive layer on the substrate, the present substrate with a conductive layer having the Gurley permeability described above has high air permeability, can be suitably used particularly for wearable devices, and can be suitably used for devices used in close contact with a living body in the field of healthcare, for example.

More specifically, the Gurley permeability can be measured by a method described later in Examples.

The present substrate with a conductive layer may have a conductive layer on one of the main surfaces (surfaces with the largest area) of the substrate or may have a conductive layer on both main surfaces of the substrate.

Because the present substrate with a conductive layer includes the substrate, which is woven or nonwoven fabric, a conductive layer (circuit) formed on one side can be coupled to, for example, a conductive layer (circuit) or an electronic component formed on the opposite side, by, for example, filling a conductive composition into voids of the substrate.

Any number of conductive layers may be formed on the substrate, and conductive layers may be appropriately formed depending on desired conductive layers (circuits).

The present substrate with a conductive layer only needs to have a substrate and a conductive layer and may have a known layer or member provided on a circuit board such as an insulating overcoat layer or an electronic component (for example, a sensor, a switch, or a connector).

Although the substrate and the conductive layer may be bonded together via an adhesive layer, the substrate and the conductive layer are preferably in contact with each other (the conductive layer is directly formed on the substrate) to better exhibit the effects of the present invention and to sufficiently bind them together even without the adhesive layer.

The present substrate with a conductive layer can be used for devices used in various fields. The present substrate with a conductive layer is very flexible. For example, the present substrate with a conductive layer can be placed on a member with a complicated shape to easily form a circuit on the member with the complicated shape.

Furthermore, the present substrate with a conductive layer has high flexibility and air permeability, has high water repellency, and is resistant to contamination. Thus, the present substrate with a conductive layer can be suitably used particularly for wearable devices and also for devices used in close contact with a living body in the field of healthcare.

<Substrate>

The substrate is a woven or nonwoven fabric containing polytetrafluoroethylene (PTFE) nanofibers, preferably a woven or nonwoven fabric composed (only) of PTFE nanofibers, more preferably a nonwoven fabric composed (only) of PTFE nanofibers.

A woven or nonwoven fabric containing PTFE nanofibers is a substrate different from an expanded substrate with a node.

In the present substrate with a conductive layer, such a substrate is less likely to contract and has high heat resistance even at high temperatures (for example, 200° C.) when the conductive layer is formed or when an electronic component is mounted.

The thickness of the substrate may be appropriately determined according to the intended use. In the aspect, for example, that a more flexible substrate with a conductive layer can be easily obtained, the thickness of the substrate preferably ranges from 1 µm to 500 mm, and more preferably 3 µm to 100 µm.

The substrate preferably has a basis weight in a range of 10 to 200 g/m$^2$, and more preferably 16 to 40 g/m$^2$.

Using a substrate with a basis weight in such a range, it is possible to easily provide a substrate with a conductive layer in which the conductive layer and the substrate are bonded with sufficient bonding strength. This is probably because, when a conductive composition containing a binder is used to form the conductive layer, the binder permeates into the substrate and easily produces the anchoring effect.

The basis weight tends to increase, for example, with the spinning time or the number of spinning nozzles.

The nonwoven or woven fabric can be produced by accumulating or weaving PTFE nanofibers into a sheet and may be composed of a single layer or two or more layers. The two or more layers may be similar layers or different layers of different materials or fiber diameters.

The nonwoven fabric can be a nonwoven fabric produced by a wet papermaking method, a water punching method, a chemical bonding method, a thermal bonding method, a spun bonding method, a needle punching method, or a stitch bonding method. A nonwoven fabric produced from self-melting fibers by the thermal bonding method or the spun bonding method is preferred in terms of heat resistance, mechanical characteristics, and solvent resistance.

The PTFE nanofibers composing the woven fabric may be any of monofilament yarns, multifilament yarns, and staple yarns. Any weave may be used, for example, plain weave, twill weave, satin weave, double weave, or tubular weave. The weave structure may include any weave construction, yarn count, and yarn density.

The PTFE nanofibers composing the nonwoven or woven fabric preferably have an average fiber diameter in a range of 100 nm to 50 µm, more preferably 500 nm to 1 µm.

An average fiber diameter in such a range can result in the formation of a flexible nonwoven or woven fabric, results in the fibers with an increased surface area, which facilitate the production of a substrate with a conductive layer in which the conductive layer and the substrate are bonded with sufficient bonding strength, and results in the fibers with higher distribution uniformity even in a thin nonwoven or woven fabric formed.

The average fiber diameter of the PTFE nanofibers composing the nonwoven or woven fabric can be adjusted by appropriately selecting the conditions for forming the nanofibers. For example, in production by an electrospinning method, the average fiber diameter of nanofibers formed tends to be reduced by lowering the humidity during the electrospinning, reducing the nozzle diameter, applying a higher voltage, or increasing the voltage density.

The average fiber diameter is an average value calculated based on measurement results obtained by observing (a set of) nanofibers of interest with a scanning electron microscope (SEM) (magnification: ×10000), randomly selecting 20 nanofibers from a captured SEM image, and measuring the nanofiber diameter (long diameter) of each nanofiber.

The PTFE nanofibers composing the nonwoven or woven fabric preferably have a coefficient of variation of fiber diameter of 0.7 or less, and more preferably 0.01 to 0.5, as calculated using the following formula. A coefficient of variation of fiber diameter in such a range results in the PTFE nanofibers with a uniform fiber diameter, which facilitate the production of a substrate with a conductive layer in which the conductive layer and the substrate are bonded with sufficient bonding strength.

Coefficient of variation of fiber diameter=standard deviation/average fiber diameter (The term "standard deviation", as used herein, refers to a standard deviation of the fiber diameters of the 20 fibers.)

The PTFE nanofibers composing the nonwoven or woven fabric preferably have a fiber length in a range of 0.1 to 1000 mm, more preferably 0.5 to 100 mm, and still more preferably 1 to 50 mm.

The PTFE nanofibers are produced, for example, by an electrospinning method, a melt spinning method, a melt electrospinning method, a spun bonding method (a melt blowing method), a wet method, or a spunlace method. In particular, nanofibers produced by the electrospinning method have a small fiber diameter, and a nonwoven or woven fabric formed of such nanofibers has high flexibility.

To form PTFE nanofibers by the electrospinning method, for example, a spinning liquid containing PTFE and optionally a solvent is used.

The spinning liquid preferably has a PTFE content in a range of 5 to 80 mass %, and more preferably 10 to 70 mass %.

The solvent may be any solvent that can dissolve or disperse PTFE and is, for example, water, dimethylacetamide, dimethylformamide, tetrahydrofuran, methylpyrrolidone, xylene, acetone, chloroform, ethylbenzene, cyclohexane, benzene, sulfolane, methanol, ethanol, phenol, pyridine, propylene carbonate, acetonitrile, trichloroethane, hexafluoroisopropanol, or diethyl ether. These solvents may be used singly, or two or more may be used in combination as a mixed solvent.

The solvent is contained in the spinning liquid in a proportion of preferably 10 to 90 mass %, and more preferably 20 to 80 mass %.

The spinning liquid may further contain additives other than PTFE such as inorganic fillers, surfactants, dispersants, charge adjustors, functional particles, adhesives, viscosity modifiers and fiber forming agents. These additives may be used singly, or two or more may be used.

When PTFE exhibits low solubility with respect to the solvent (for example, when the solvent is water), the spinning liquid preferably contains one or two or more fiber forming agents in order to retain the PTFE to form fibers during spinning.

The fiber forming agents are preferably organic polymers exhibiting high solubility with respect to solvents. Examples thereof include polyethylene oxide, polyethylene glycol, dextran, alginic acid, chitosan, starch, polyvinylpyrrolidone, polyacrylic acid, polymethacrylic acid, polyacrylamide, cellulose and polyvinyl alcohol.

When the fiber forming agent is used, the amount thereof is, for example, 0.1 to 15 mass %, and preferably 1 to 10 mass % in the spinning liquid. However, the amount is variable depending on the viscosity of the solvent and/or the solubility in the solvent.

The spinning liquid can be prepared by mixing PTFE, the solvent and optionally the additives according to a known method.

A preferred example of the spinning liquids is the following spinning liquid (1).

Spinning liquid (1): A spinning liquid containing PTFE in 30 to 70 mass %, preferably 35 to 60 mass %, and the fiber forming agent in 0.1 to 10 mass %, preferably 1 to 7 mass %, and containing a solvent so that the total is 100 mass %.

The voltage applied during the electrospinning is preferably 1 to 100 kV, more preferably 5 to 50 kV, and still more preferably 10 to 40 kV.

The tip diameter (outer diameter) of the spinning nozzle is preferably 0.1 to 2.0 mm, and more preferably 0.2 to 1.6 mm.

When, for example, the spinning liquid (1) is used, the applied voltage is preferably 10 to 50 kV, and more preferably 10 to 40 kV, and the tip diameter (outer diameter) of the spinning nozzle is preferably 0.3 to 1.6 mm.

After the nonwoven or woven fabric is formed from the PTFE nanofibers, heat treatment is preferably performed. The heat treatment is performed by heat-treating the nonwoven or woven fabric typically at 200 to 390° C. for 30 to 300 minutes. The heat treatment can remove, for example, the solvent and the fiber forming agent remaining in the nonwoven or woven fabric.

A method for producing the nonwoven fabric may be a known production method, for example, the following method described in JP-A-2012-515850.

A method including:
a step of providing a spinning liquid including PTFE, a fiber forming agent and a solvent, and having a viscosity of at least 50,000 cP, preferably a spinning liquid (1);
a step of spinning the spinning liquid through a nozzle to fiberize by electrostatic force;
a step of collecting the fibers onto a collector (for example, a take-up spool) to form a precursor; and
a step of calcining the precursor to remove the solvent and the fiber forming agent thereby forming a nonwoven fabric composed of PTFE nanofibers.

<Conductive Layer>

<Conductive Layer>

The conductive layer may be any layer with conductivity formed from a conductive composition and is, for example, a circuit. The conductive composition may be any composition with a viscosity in a range of 1 to 500 Pa·s measured at 25° C. with the rotational viscometer at a rotational speed of 50 rpm, may be a known composition, and is preferably a conductive composition containing a conductive filler and a binder.

The term "conductive composition", as used herein, means that a conductive layer formed from the composition has a specific resistance of less than $1 \times 10^{-3}$ Ω·cm. The specific resistance can be determined by measuring a resistance with a digital multimeter and calculating the specific resistance using the following formula.

$$\text{Specific resistance}(\Omega \cdot cm) = R \times S/l$$

[R: resistance value of digital multimeter, S: cross-sectional area of conductive layer, l: interelectrode distance]

The conductive composition has a viscosity in a range of 1 to 500 Pa·s, preferably 10 to 100 Pa·s, and more preferably 10 to 50 Pa·s, as measured at 25° C. with the rotational viscometer at a rotational speed of 50 rpm.

At a viscosity in such a range, a substrate with a conductive layer can be easily produced in which the conductive layer and the substrate are bonded with sufficient bonding strength even when the substrate is a PTFE substrate, which is essentially non-adhesive. This is probably because, when a conductive composition containing a binder with a viscosity in such a range is used to form the conductive layer, the binder permeates into the substrate and easily produces the anchoring effect.

The conductive filler may be any conductive filler and may be a known filler.

The conductive filler used for the conductive composition may be of one type or two or more types with different shapes, sizes, or materials.

The materials of the conductive filler are not particularly limited unless the materials have conductivity, and examples thereof include a metal such as copper, silver, gold, platinum, tin, bismuth, zinc, indium, nickel, or palladium, an alloy containing these metals, carbon black, or graphite. Among these, copper, silver, and carbon black are preferred.

The conductive filler may be a filler produced by plating the surface of a material with, for example, the metal or alloy.

The conductive filler may have any shape and is, for example, massive, spherical, flaky, acicular, fibrous, dendritic, or coiled.

In the aspects, for example, that a composition with good coatability can be easily obtained, that a highly conductive layer can be easily obtained, the conductive filler preferably has a median diameter (D50) in a range of 5 to 30 μm as measured by a laser diffraction scattering method (Microtrac method).

In the aspect, for example, that a highly conductive layer can be easily obtained, a content of the conductive filler is preferably from 60 to 95 mass %, and more preferably from 65 to 93 mass %, relative to 100% by mass of the conductive composition.

The binder may be any binder and is preferably a binder that can hold the conductive filler.

The binder used for the conductive composition may be of one type or two or more types.

Examples of the binder include, but are not limited to, thermoplastic resins such as polyester resins, acrylic resins, butyral resins, and thermoplastic imide resins; thermosetting resins, including epoxy resins such as bisphenol A type, bisphenol F type, and novolac type, epoxy compounds such as liquid epoxy compounds, polyester resins such as unsaturated polyester resins, urethane resins, phenolic resins such as resole type and novolac type, imide resins, and silicone rubbers; and elastomers such as styrene elastomers, olefin elastomers, polyester elastomers, polyurethane elastomers, polyamide elastomers, and silicone elastomers.

Among these, thermosetting resins are preferred, for example, because they permeate in the substrate and cure in the state, and produce the anchoring effect, which facilitates the production of a substrate with a conductive layer having higher bonding strength between the conductive layer and the substrate.

In the aspects, for example, that the binder can sufficiently hold the conductive filler and a conductive layer with high conductivity and shape retention ability, can be easily obtained, the binder content preferably ranges from 5 to 35 parts by mass, and more preferably 7 to 20 parts by mass, relative to 100 parts by mass of the conductive filler.

The conductive composition preferably contains one or two or more solvents in terms of, for example, coatability. Examples of the solvents include, but are not limited to, alcohol solvents such as methanol, ethanol, isopropyl alcohol, butyl carbitol, butyl cellosolve, and propylene glycol monomethyl ether; aromatic solvents such as toluene and xylene; ketone solvents such as methyl isobutyl ketone; and ester solvents, such as methyl acetate, ethyl acetate, and butyl carbitol acetate.

If necessary, the conductive composition may contain a known additive other than the components described above, without losing the advantages of the present invention.

Examples of such additives include saturated fatty acids such as palmitic acid and stearic acid; unsaturated fatty acids such as linolenic acid, linoleic acid, and oleic acid; metal salts thereof (examples of the metals: sodium and potassium); organic acids with a hydroxy group such as lactic acid and tartaric acid; organic acids with a sulfonate group such as alkyl sulfonic acids and alkylbenzene sulfonic acids; metal chelate forming agents; curing agents for curing a curable resin; dispersants; film-forming aids; surface conditioners; plasticizers; antioxidants; and pigments.

These additives may be of one type or two or more types.

The conductive layer may have any thickness and may have the same thickness as a known circuit. The thickness preferably ranges from 1 to 1000 μm, more preferably 1 to 200 μm, and still more preferably 1 to 100 μm, in aspect to, for example, retain a desired conductive layer without separation and wire breakage even when the substrate with a conductive layer is bent.

The present substrate with a conductive layer may contain a dried or cured product of the conductive composition inside the substrate. Even in such a case, the thickness of the conductive layer refers to the thickness from the surface of the substrate.

<Method for Producing Present Substrate with Conductive Layer>

The present substrate with a conductive layer may be produced by any method, which preferably includes the step of applying the conductive composition to the substrate and drying or curing the applied composition.

The conductive composition may be applied by any method, including a known method, such as screen printing, pad printing, flexographic printing, ink jet printing, or gravure printing.

The conductive composition is preferably applied such that the conductive layer formed has a desired shape and thickness.

The composition may be dried or cured under any conditions, which may be appropriately selected according to, for example, the conductive composition to be used (the type of binder or solvent), and may be dried and/or cured at normal temperature, may be dried and/or cured while heating, or may be dried and/or cured under light irradiation. Heating and light irradiation may be combined.

If necessary, the drying or curing may be performed under reduced pressure or in an inert gas atmosphere such as a nitrogen gas atmosphere.

EXAMPLES

Next, an embodiment of the present invention is described in more detail with examples, but the present invention is not limited to these examples.

Example 1

A nonwoven fabric composed of PTFE nanofibers was used as a substrate (thickness: 55 μm, basis weight: 24 g/m$^2$, average pore diameter [measured with a Perm-Porometer (CFP-1200-AEL) manufactured by Porous Materials Inc. (the average pore diameters described below were also measured in the same manner)]: 2 μm, average fiber diameter: 900 nm, main surface size: 100 mm in length×100 mm in width). A conductive ink 1 (manufactured by ThreeBond Co., Ltd., viscosity measured at 25° C. with a rotational viscometer (rotational speed condition: 50 rpm): 20 Pa·s, containing silver particles) was screen-printed on a main surface of the substrate using a screen and a squeegee to form a conductive layer (a circuit) with a linewidth of 0.5 mm, a conductive layer interval of 1.0 mm, a length of 100 mm, and a thickness of 25 μm.

The printed conductive ink 1 was heated at 160° C. for 1 hour to prepare a substrate with a conductive layer.

Example 2

A substrate with a conductive layer was prepared in the same manner as in Example 1 except that the conductive ink 1 in Example 1 was substituted by a conductive ink 2 (CR-5200 (manufactured by Kaken Tech Co., Ltd.), viscosity measured at 25° C. with a rotational viscometer (rotational speed condition: 50 rpm): 20 Pa·s, containing silver particles) and that the curing conditions were changed to heating at 100° C. for 1 hour.

Example 3

A substrate with a conductive layer was prepared in the same manner as in Example 1 except that a nonwoven fabric composed of PTFE nanofibers (thickness: 72 μm, basis weight: 32 g/m$^2$, average pore diameter: 2 μm, average fiber diameter: 900 nm) was used as the substrate.

Example 4

A substrate with a conductive layer was prepared in the same manner as in Example 1 except that a nonwoven fabric composed of PTFE nanofibers (thickness: 92 μm, basis weight: 40 g/m², average pore diameter: 2 μm, average fiber diameter: 900 nm) was used as the substrate.

Example 5

A substrate with a conductive layer was prepared in the same manner as in Example 1 except that the screen printing in Example 1 was substituted by ink jet printing of the conductive ink 1 using a desktop precision coating apparatus (manufactured by SSI Japan) such that the conductive layer (circuit) formed had a linewidth of 0.5 mm, a conductive layer interval of 1.0 mm, a length of 100 mm, and a thickness of 150 μm.

Comparative Example 1

A substrate with a conductive layer was prepared in the same manner as in Example 1 except that a PTFE film (Valflon cutting tape (manufactured by Valqua, Ltd.), solid film, thickness: 100 μm, main surface size: 100 mm in length×100 mm in width) was used as the substrate.

Comparative Example 2

A substrate with a conductive layer was prepared in the same manner as in Example 1 except that an expanded PTFE film (sa-PTFE (manufactured by Valqua, Ltd.), thickness: 25 μm, average pore diameter: 0.1 μm, main surface size: 100 mm in length×100 mm in width) was used as the substrate.

<Heat Resistance>

The contraction rate was calculated using the following formula from the lateral length (width length) of a main surface of the substrate (the nonwoven fabric composed of PTFE nanofibers, the PTFE film, or the expanded PTFE film) before the application of the conductive ink and the lateral length of a main surface of the prepared substrate with a conductive layer.

A contraction rate of less than 5% was rated AA, and a contraction rate of more than 5% was rated CC. Table 1 shows the results.

Contraction rate (%)=(lateral length of main surface of substrate before application of conductive ink−lateral length of main surface of prepared substrate with conductive layer)×100/lateral length of main surface of substrate before application of conductive ink <Continuous Bending Test>

A paper sheet (thickness: 93 μm, 70 g/m²) was used as a support for a continuous bending test. The paper was attached using a tape to the prepared substrate with a conductive layer opposite the conductive layer to prepare a specimen for a bending test.

The specimen was bent 2000 times such that the conductive layer was bent using a bending tester (MIT-D, manufactured by Toyo Seiki Seisaku-Sho, Ltd.) at a test speed of 90 cpm, a bending angle of 135 degrees, and a radius of curvature of 0.38 mm.

The state of the conductive layer before and after the bending was visually inspected, and the electrical resistance of the conductive layer was measured with SK-6555 (manufactured by Kaise Corporation) and was rated according to the following criteria. Table 1 shows the results.

AA: The absolute value of the rate of change in electrical resistance of the conductive layer before and after the continuous bending test ((1−electrical resistance after the continuous bending test)×100/electrical resistance before the continuous bending test) was 50% or less, the conductive layer was not separated from the substrate, and there was no crack in the conductive layer.

CC: At least one of the following was satisfied: the absolute value of the rate of change in electrical resistance of the conductive layer before and after the continuous bending test ((1−electrical resistance after the continuous bending test)×100/electrical resistance before the continuous bending test) was more than 50%; the conductive layer was separated from the substrate; and there was a crack in the conductive layer.

<Gurley Permeability>

The Gurley permeability of the prepared substrate with a conductive layer was measured with G-B3C manufactured by Toyo Seiki Seisaku-Sho, Ltd. in accordance with JIS P 8117: 2009. Table 1 shows the results.

The Gurley permeability in Comparative Example 1 could not be measured due to no air permeability and was indicated by "—" in Table 1.

TABLE 1

| | Substrate type | Heat resistance | Continuous bending test | Gurley permeability (s/100 ml) |
|---|---|---|---|---|
| Example 1 | Nanofiber | AA | AA | 0.5 |
| Example 2 | Nanofiber | AA | AA | 0.5 |
| Example 3 | Nanofiber | AA | AA | 0.7 |
| Example 4 | Nanofiber | AA | AA | 0.9 |
| Example 5 | Nanofiber | AA | AA | 0.5 |
| Comparative example 1 | Film | AA | CC | — |
| Comparative example 2 | Expanded film | CC | AA | 22.9 |

The substrates with a conductive layer prepared in Examples were subjected to energy dispersive X-ray analysis (EDX) with SDD-EMAX x-act (manufactured by Horiba, Ltd.). The analysis showed that the resin of the conductive ink permeated into the nonwoven fabric. Due to the anchoring effect of the permeating resin, a desired conductive layer that does not separate even after, for example, the continuous bending test could be formed even on the nonwoven fabric composed of PTFE nanofibers, which is essentially non-adhesive.

What is claimed is:

1. A substrate with a conductive layer comprising:
    a substrate, which is a woven or nonwoven fabric comprising polytetrafluoroethylene nanofibers; and
    a conductive layer formed on the substrate, the conductive layer being formed from a conductive composition with a viscosity in a range of from 1 to 500 Pa·s measured at 25° C. with a rotational viscometer at a rotational speed of 50 rpm,
    wherein the following requirement (1) is satisfied:
    requirement (1); the substrate with a conductive layer has a Gurley permeability of 10 s/100 ml or less.

2. The substrate with a conductive layer according to claim 1, wherein the conductive composition comprises a conductive filler and a thermosetting resin.

3. The substrate with a conductive layer according to claim 1, wherein the substrate before the conductive layer is formed has a basis weight in a range of from 10 to 200 g/m².

* * * * *